(12) United States Patent
Kang

(10) Patent No.: US 7,982,252 B2
(45) Date of Patent: Jul. 19, 2011

(54) DUAL-GATE NON-VOLATILE FERROELECTRIC MEMORY

(75) Inventor: Hee-Bok Kang, Cheongju-si (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 369 days.

(21) Appl. No.: 11/433,753

(22) Filed: May 11, 2006

(65) Prior Publication Data

US 2007/0176218 A1    Aug. 2, 2007

Related U.S. Application Data

(60) Provisional application No. 60/762,672, filed on Jan. 27, 2006.

(51) Int. Cl.
*H01L 21/02* (2006.01)
*H01L 21/00* (2006.01)

(52) U.S. Cl. ........... 257/295; 438/3; 257/E27.104; 257/E21.663; 257/E21.664

(58) Field of Classification Search ............ 257/295, 257/314–326, E27.104, E21.663, E21.664; 438/3, 257–267
See application file for complete search history.

(56) References Cited

U.S. PATENT DOCUMENTS

| | | | | |
|---|---|---|---|---|
| 4,584,672 A | * | 4/1986 | Schutz et al. | 365/203 |
| 5,723,885 A | * | 3/1998 | Ooishi | 257/295 |
| 6,532,165 B1 | * | 3/2003 | Katori | 365/145 |
| 6,787,832 B2 | | 9/2004 | Schmid et al. | |
| 2003/0103391 A1 | | 6/2003 | Kang | |
| 2004/0027850 A1 | | 2/2004 | Kang | |
| 2005/0036358 A1 | | 2/2005 | Kang | |
| 2005/0127454 A1 | * | 6/2005 | Liou et al. | 257/390 |
| 2005/0128783 A1 | | 6/2005 | Kang | |
| 2005/0231998 A1 | | 10/2005 | Kang | |
| 2005/0237784 A1 | | 10/2005 | Kang | |
| 2006/0012587 A1 | * | 1/2006 | Stevenson et al. | 345/204 |
| 2006/0138504 A1 | * | 6/2006 | Kang et al. | 257/295 |
| 2007/0029618 A1 | * | 2/2007 | Walker | 257/368 |

OTHER PUBLICATIONS

Avci, et al., "Theoretical and Experimental Analysis of Back-Gated SOI MOSFETs and Back-Floating NVRAMs," J. of Semiconductor Technology and Science, 2004, pp. 18-26, vol. 4, No. 1.
Chang, et al., "A Planar Gate Double Beryllium Implanted GaAs Power MESFET for Low Voltage Digital Wireless Communication Application," IEEE Transactions on Electron Devices, Jun. 2000, pp. 1134-1138, vol. 47, No. 6, IEEE.
Chang, et al., "Gate Length Scaling and Threshold Voltage Control of Double-Gate MOSFETs," 2000, pp. 719-722, IEEE.
Ishiwara, "Current Status of FET-Type Ferroelectric Memories," Proc. 22nd International Conference on Microelectronics, May 14-17, 2000, pp. 423-427, vol. 2, IEEE.
Ishiwara, "Current Status of FET-Type Ferroelectric Memories," 2001, pp. 331-336, IEEE.
Oh, et al., "Analytic Description of Short-Channel Effects in Fully-Depleted Double-Gate and Cylindrical, Surrounding-Gate MOSFETs," IEEE Electron Device Letters, Sep. 2000, pp. 445-447, vol. 21, No. 9, IEEE.
Tang, et al., "Comparison of Short-Channel Effect and Offstate Leakage in Symmetric vs. Asymmetric Double Gate MOSFETs," 2000 IEEE International SOI Conference, Oct. 2000, pp. 120-121, IEEE.

* cited by examiner

*Primary Examiner* — Hsien-ming Lee
*Assistant Examiner* — Kevin Parendo
(74) *Attorney, Agent, or Firm* — Kilpatrick Townsend and Stockton LLP

(57) ABSTRACT

A dual-gate non-volatile memory cell includes a first dielectric layer extending over a first gate, a semiconductor region extending over the first dielectric layer, a second dielectric layer comprising tunnel oxide extending over the semiconductor region, a ferroelectric layer extending over the second dielectric layer, and a second gate extending over the ferroelectric layer.

12 Claims, 14 Drawing Sheets

US 7,982,252 B2

DUAL-GATE NON-VOLATILE FERROELECTRIC MEMORY

CROSS-REFERENCES TO RELATED APPLICATIONS

This application claims the benefit of U.S. Provisional Application No. 60/762,672, filed Jan. 27, 2006, which disclosure is incorporated herein by reference in its entirety for all purposes.

Additionally, commonly assigned application Ser. No. 11/115,131, filed Apr. 27, 2005, titled "Non-Volatile Ferroelectric Memory Device," is incorporated herein by reference in its entirety.

BACKGROUND OF THE INVENTION

The present invention relates in general to non-volatile ferroelectric memory technology, and more particularly to an improved ferroelectric memory cell, its method of manufacture and method of operation as used in an array of such memory cells.

The ferroelectric random access memory (hereinafter referred to as "FeRAM") has attracted considerable attention as next generation memory device because it has data processing speeds comparable to those of Dynamic Random Access Memories (hereinafter, referred to as "DRAMs"), and unlike DRAMs, conserves the data even after the power is turned off.

A unit cell of a conventional non-volatile FeRAM device comprises a switching element and a non-volatile ferroelectric capacitor. The switching element performs a switching operation depending on a state of a wordline to connect a non-volatile ferroelectric capacitor to a sub-bitline. The non-volatile ferroelectric capacitor is connected between a plate line and one terminal of the switching element. The switching element of the conventional FeRAM is a NMOS transistor whose switching operation is controlled by a gate control signal.

FIG. 1 is a cross-sectional diagram illustrating another conventional non-volatile ferroelectric memory device commonly referred to as one-transistor metal ferroelectric semiconductor field effect transistor (MFSFET). The one-transistor MFSFET cell comprises an N-type drain region 2 and an N-type source region 3 both formed in a P-type substrate 1. A ferroelectric layer 4 is formed on a channel region of the cell, and a gate (wordline) 5 is formed on ferroelectric layer 4.

Data is read from or written to the FeRAM cell using a channel resistance of the memory cell which varies depending on the polarization state of ferroelectric layer 4. For example, upon applying a negative voltage to gate 5, ferroelectric layer 4 is polarized such that positive charges are attracted to the channel region. The memory cell thus obtains a high resistance state, and would be in the off state when 0V is applied to gate 5. Conversely, upon applying a positive voltage to gate 5, ferroelectric layer 4 is polarized such that negative charges are attracted to the channel region. The memory cell thus obtains a low resistance state and would be in the on state when 0V is applied to gate 5.

However, these conventional non-volatile FeRAM cells suffer from a number of drawbacks. First, conventional MFSFET cells perform poorly where random access operation is required and also have poor data retention because of read and write disturbs present during operation. Also, the date retention is adversely impacted as the cell size is scaled down. Additionally, the crystal inconsistencies at the interface between ferroelectric film 5 and substrate silicon 1 require a special manufacturing process, thus increasing the process complexity and cost. The crystal inconsistencies also prevent reduction of the channel length and thus hinder scaling of the cell.

Accordingly, there is a need for an improved, versatile, and low cost FeRAM cell technology which enables scaling of the cell without impacting the performance characteristics of the memory device.

BRIEF SUMMARY OF THE INVENTION

In accordance with an embodiment of the invention, a non-volatile memory structure includes a first gate electrode comprising a conductive material, a first dielectric layer extending over the first gate electrode, a first semiconductor region extending over the first dielectric layer, a second dielectric layer extending over the first semiconductor region, a first ferroelectric layer extending over the second dielectric layer, and a second gate electrode comprising a conductive material extending over the first ferroelectric layer.

In one embodiment, the second dielectric layer comprises tunnel oxide.

In another embodiment, the first semiconductor region comprises a source region, a drain region and a channel region therebetween, wherein the source region and the drain region have a conductivity type opposite that of the channel region.

In yet another embodiment, the source region, the drain region, and the channel region are of the same conductivity type.

In another embodiment, the non-volatile memory structure further includes a substrate and a dielectric material extending over the substrate but underneath first gate electrode.

In accordance with another embodiment of the invention, a non-volatile memory structure is formed as follows. A first gate electrode comprising a conductive material is formed over a dielectric material. A first dielectric layer extending is formed over the first gate electrode. A first semiconductor region is formed extending over the first dielectric layer. A second dielectric layer is formed extending over the first semiconductor region. A first ferroelectric layer is formed extending over the second dielectric layer. A second gate electrode comprising a conductive material is formed extending over the first ferroelectric layer.

In one embodiment, the second dielectric layer comprises tunnel oxide.

In another embodiment, the method further includes, after forming the second gate electrode, implanting dopants into the first semiconductor region to thereby form a source region and a drain region in the first semiconductor region such that the source and drain regions are separated by a channel region. The source and drain regions are of opposite conductivity type to the channel region.

In another embodiment, the first semiconductor region comprises a source region and a drain region separated by a channel region, the source region and the drain region being of the same conductivity type as the channel region.

In accordance with yet another embodiment, a non-volatile memory includes a memory array having a plurality of strings of serially connected memory cells arranged along rows and columns, wherein each memory cell includes: a first gate comprising a conductive material forming part of a bottom wordline extending horizontally through the memory array, a first dielectric layer extending over the first gate, a semiconductor region extending over the gate dielectric layer, a second dielectric layer extending over the semiconductor region, a ferroelectric layer extending over the second dielectric layer, and a second gate comprising a conductive material extending over the ferroelectric layer, the second gate forming part of a top wordline extending parallel to the bottom wordline.

In one embodiment, each string of serially connected memory cells has one end connected to a bitline through a first select transistor and another end connected to a source line through a second select transistor.

In another embodiment, the semiconductor region of all memory cells within each string of serially connected memory cells are connected together to form a floating channel layer extending vertically, wherein the floating channel layer has one end connected to a bitline through a first select transistor and another end connected to a source line through a second select transistor.

In another embodiment, the second dielectric layer comprises tunnel oxide.

In another embodiment, two or more of the plurality of strings of serially connected memory cells are stacked on top of but insulated from one another.

In yet another embodiment, the semiconductor region includes a source region, a drain region and a channel region extending between the source and drain regions, wherein the source region and the drain region have a conductivity type opposite that of the channel region.

In another embodiment, each string of serially connected memory cells has one end connected to a bitline through a first select transistor and another end connected to a source line through a second select transistor.

In another embodiment, the source region, the drain region, and the channel region are of a first conductivity type, and each of the first and second select transistors includes a source region, a drain region and a channel region extending between the source and drain regions, the source region, the drain region and the channel region of each of the first and second transistors being of the first conductivity type.

In another embodiment, the source region, the drain region, and the channel region are of a first conductivity type, and each of the first and second select transistors includes a source region, a drain region and a channel region extending between the source and drain regions, the source region and the drain region of each of the first and second transistors being of a second conductivity type.

DETAILED DESCRIPTION OF THE INVENTION

An improved dual-gate non-volatile ferroelectric memory technology which overcomes many drawbacks of prior art techniques is disclosed in the commonly assigned patent application Ser. No. 11/115,131, titled "Non-Volatile Ferroelectric Memory Device," which disclosure is incorporated herein by reference. Further improvements to the dual-gate non-volatile ferroelectric memory technology are described next.

Figure 1:
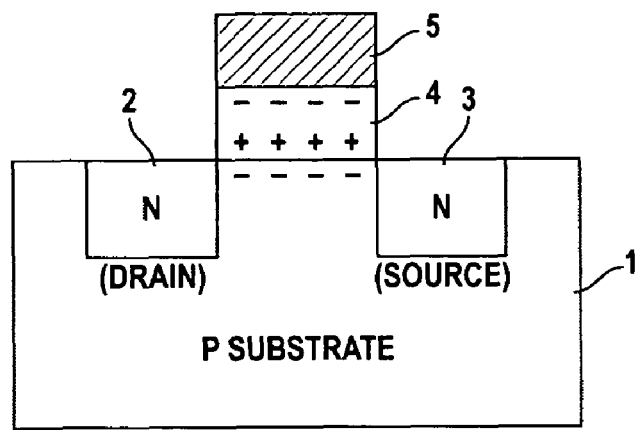
FIG. 1 is a cross-sectional diagram illustrating a conventional non-volatile ferroelectric memory device.
Figure 2A:
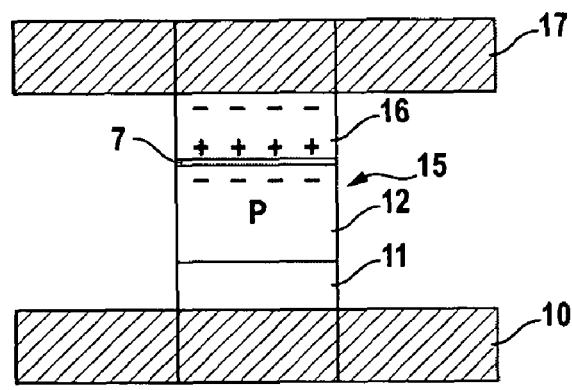
FIGS. 2a and 2b are cross section views of a dual-gate non-volatile ferroelectric memory cell along the wordline and bitline dimension, respectively, in accordance with an embodiment of the invention.
Figure 2B:
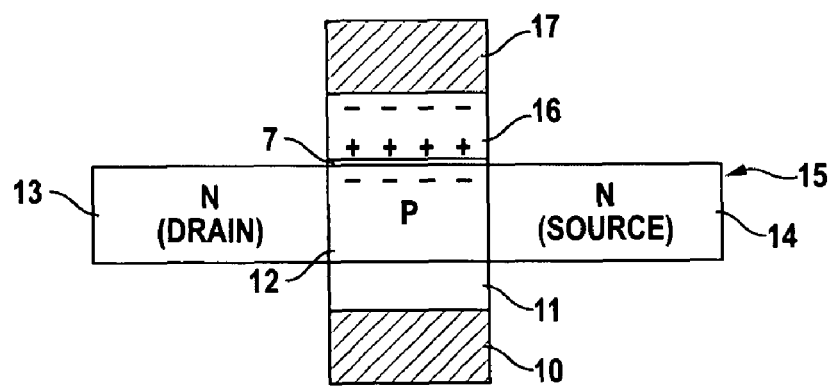
Figure 2C:
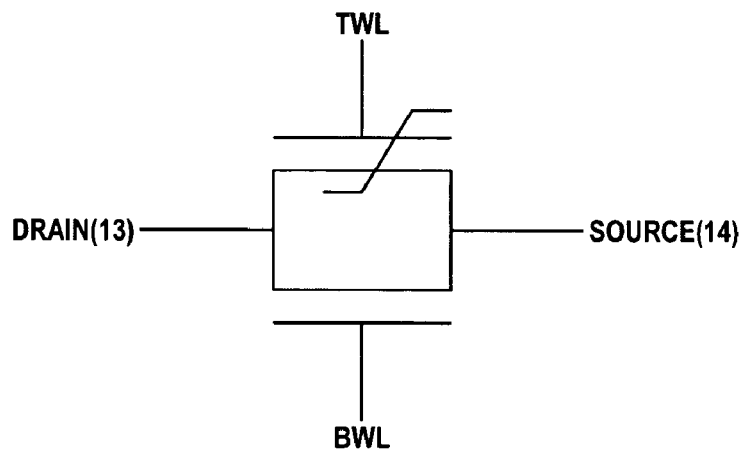
FIG. 2c is a circuit representation of the dual-gate cell depicted by cross section views in FIGS. 2a and 2b.

FIGS. 2a and 2b are cross section views of a dual-gate non-volatile ferroelectric memory cell, and FIG. 2c is a circuit representation of the dual-gate cell, in accordance with an embodiment of the invention. FIG. 2a is a cross section view along the wordline dimension. A bottom wordline 10 (e.g.

comprising polysilicon) is arranged in parallel with a top wordline 17 (e.g., comprising polysilicon). Bottom wordline 10 and top wordline 17 are selectively driven by a row decoder (not shown). A gate dielectric layer 11 (e.g., comprising oxide) insulates bottom wordline 10 from an overlying P-type channel region 12 of a floating channel layer 15. A dielectric layer 7 (e.g., comprising tunnel oxide) is formed over channel region 12 of floating channel layer 15. Ferroelectric layer 16 is formed over dielectric layer 7, and a top wordline 17 is formed over ferroelectric layer 16. A six layer cell structure is thus formed.

FIG. 2b is a cross section view along the bitline dimension (i.e., perpendicular to the wordline dimension). The same six layer structure is apparent in FIG. 2b, except that floating channel layer 15 is shown to include N-type source region 14 and N-type drain region 13 flanking each side of P-type channel region 12. Floating channel layer 15 comprises semiconductor material including one or more of carbon nano tube, nano-materials, nano-wires, silicon and Ge (Germanium), and/or other suitable material. Also, channel layer 15 is referred to as a "floating" channel layer because it is insulated by dielectric material extending above and below it.

The dual-gate cell depicted by FIGS. 2a and 2b is formed over a non-conducting material such as dielectric material (not shown), and as such the cell structure as well as its operation are completely independent of the starting material (or substrate). Thus, any starting material including commercially available starting material such as bulk silicon and silicon-on-insulator (SOI) can be used.

The dual-gate memory cell depicted by FIGS. 2a and 2b is formed as follows. A conductive material (e.g., comprising polysilicon) is formed over an insulator, and is then patterned and etched to form the bottom wordline 10, using known techniques. A first dielectric layer 11 (e.g., oxide) extending over bottom wordline 10 is formed using conventional techniques. A semiconductor region 15, such as carbon nano tube, nano-materials, nano-wires, silicon or germanium extending over the gate dielectric layer is formed. A second dielectric layer 7 (e.g., tunnel oxide) extending over the semiconductor region 15 is formed. Next, a ferroelectric layer 16 extending over the second dielectric layer 7 is formed. A second conductive material 17 (e.g., comprising polysilicon) extending over the ferroelectric layer 16 is then formed. N-type Dopants are then implanted into the semiconductor region 15 to form a source region 14 and a drain region 13 in the semiconductor region 15, the source and drain regions being separated by a P-type channel region.

In FIG. 2c, the circuit representation of the cell includes two parallel-coupled transistors with a common source terminal 14 and a common drain terminal 14. The bottom transistor is a MOS transistor with its gate coupled to the bottom wordline BWL, and the upper element is a ferroelectric-based transistor with its gate coupled to TWL. This circuit representation of the cell is used in other figures to illustrate various array configurations.

An advantage of the cell structure in FIGS. 2a, 2b is that by including a dielectric layer 7, such as a tunnel oxide layer, between ferroelectric film 16 and channel region 12, the process complexities of the prior art arising out of the crystal inconsistencies at the ferroelectric film to silicon interface are eliminated. This also enables reduction of the channel length without any adverse effects on the device performance characteristics. Note that in addition to tunnel oxide, other non-conducting material with appropriate time constant may also be used as layer 7.

In one embodiment, data is read from or written to the cell using the channel resistance of channel region 12 which varies depending on the polarization state of ferroelectric layer 16. Upon applying a negative voltage to top wordline 17, ferroelectric layer 16 is polarized such that positive charges are attracted to channel region 12. The memory cell thus obtains a high resistance state, and would be in the off state when 0V is applied to bottom wordline 10. Conversely, upon applying a positive voltage to top wordline 17, ferroelectric layer 16 is polarized such that negative charges are attracted to channel region 12. The memory cell thus obtains a low resistance state and would be in the on state when 0V is applied to bottom wordline 10.

Figure 3A:
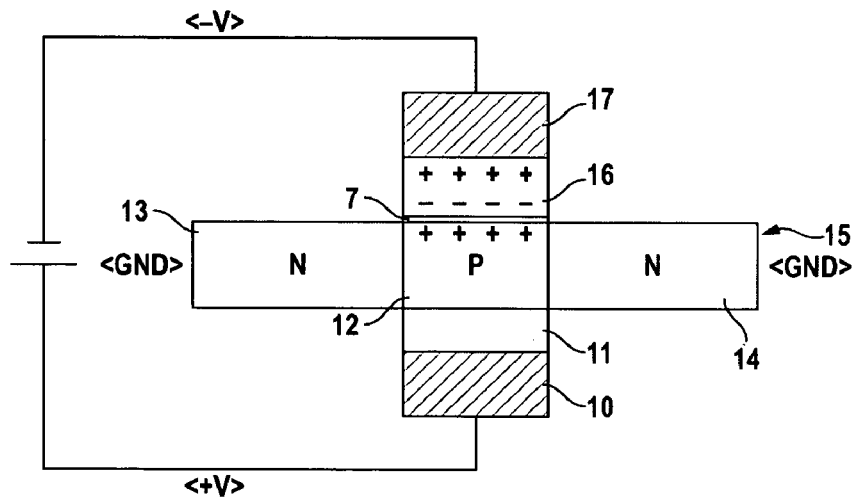
FIGS. 3a and 3b are cross section views similar to that in FIG. 2b, respectively illustrating write and read of a high data (data "1") according to an embodiment of the present invention.
Figure 3B:
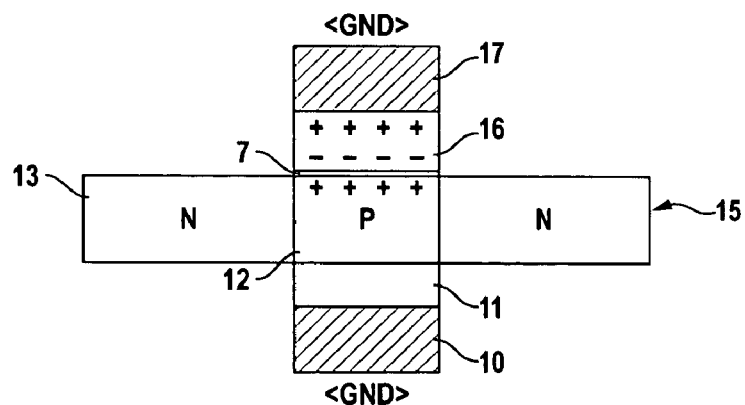

FIGS. 3a and 3b will be used to describe write and read operations with a high data (data "1") stored in the non-volatile ferroelectric memory cell according to an embodiment of the present invention. In FIG. 3a, a data "1" is written by applying a positive voltage <+V> to bottom wordline 10, a negative voltage <−V> to top wordline 17, and biasing drain region 13 and source region 14 to ground voltage <GND>. Positive charges are thus attracted to channel region 12 whereby the memory cell obtains a high resistance state and thus stores a data "1". In one embodiment, the positive voltage <+V> has a value greater than a threshold voltage Vth of the bottom MOS transistor of the cell, and the negative voltage <−V> is equal in magnitude to or greater than the coercive voltage of the top ferroelectric-based transistor of the cell. The coercive voltage represents the voltage which when applied across the ferroelectric film, the ferroelectric film polarizes in a particular state.

In FIG. 3b, the data "1" stored in the cell is read by applying a ground voltage <GND> to both the bottom wordline 10 and top wordline 17. With positive charges in the channel region and drain region 13 and source region 14 at the ground potential, the cell is in the off state corresponding to a stored data "1". In this state, when a small voltage difference is applied across the drain/source, a small current flows through the cell as opposed to the large current that flows through the cell when it is programmed to the conducting state.

Figure 4A:
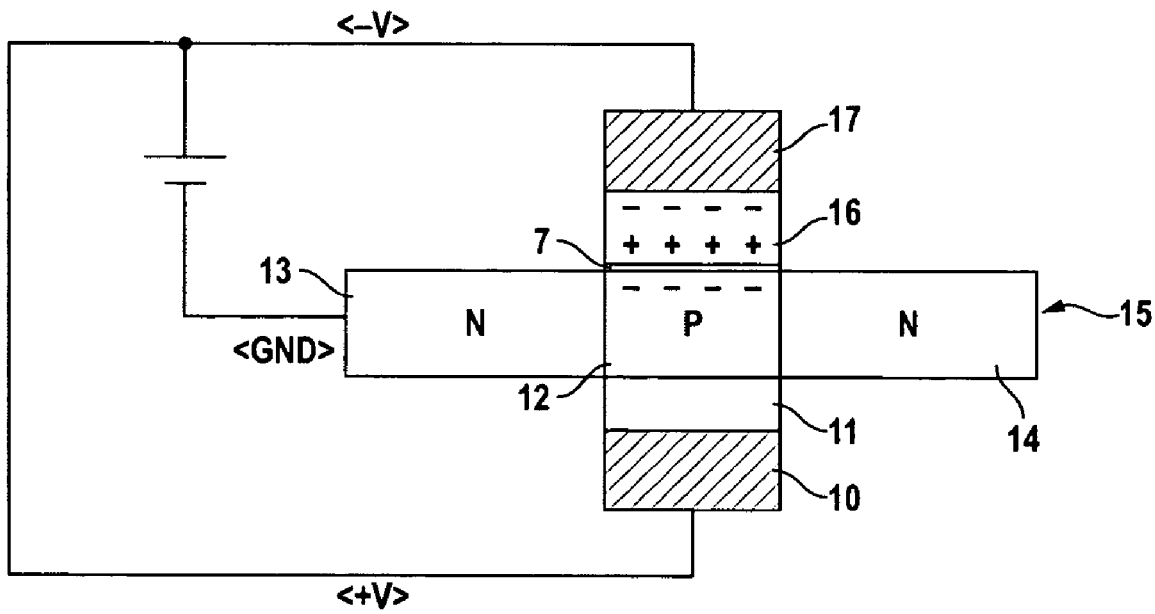
FIGS. 4a and 4b are cross section views similar to that in FIG. 2b, respectively illustrating write and read of a low data (data "0") according to an embodiment of the present invention.
Figure 4B:
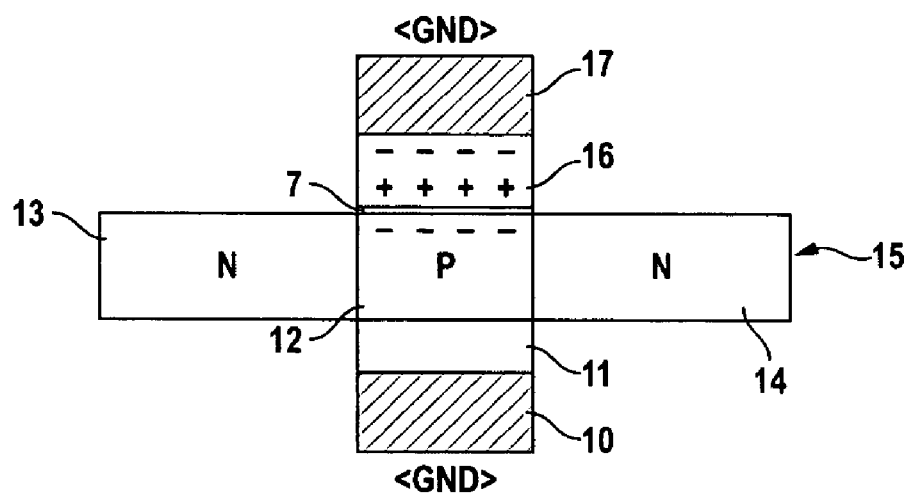

FIGS. 4a and 4b will be used to describe write and read operations with a low data (data "0") stored in the non-volatile ferroelectric memory cell according to an embodiment of the present invention. In FIG. 4a, a data "0" is written by applying a positive voltage <+V> to both the bottom wordline 10 and top wordline 17, and applying ground voltage <GND> to the drain region 13 and the source region 14. Negative charges are thus attracted to channel region 12 whereby the memory cell obtains a low resistance state and thus stores a data "0".

In FIG. 4b, the data "0" stored in the cell is read by applying a ground voltage <GND> to both the bottom wordline 10 and top wordline 17. With negative charges in the channel region, even with drain region 13 and source region 14 biased at ground potential, the cell is in the on state and conducts a large current. During read operations, because low voltages (e.g., ground potential) are applied to the top and bottom wordlines, no stress is created across the ferroelectric layer 16, and thus the cell data retention characteristics is improved.

Figure 5:
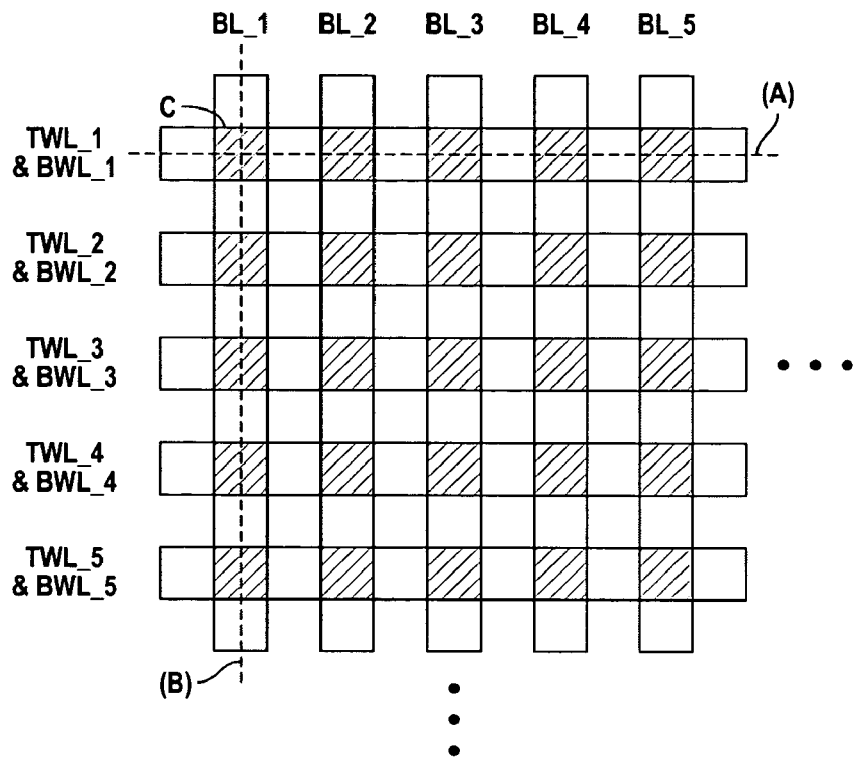
FIG. 5 is a layout diagram illustrating the dual-gate non-volatile ferroelectric memory array according to an embodiment of the present invention.

FIG. 5 is a layout diagram illustrating the non-volatile ferroelectric memory array according to an embodiment of the present invention. A plurality of top wordlines TWL are arranged in parallel with a corresponding plurality of bottom wordlines BWL in a row direction. A plurality of bit lines BL are arranged perpendicular to the plurality of wordlines. A plurality of unit cells C are located where the plurality of top and bottom wordlines and the plurality of bit lines intersect.

Figure 6A:
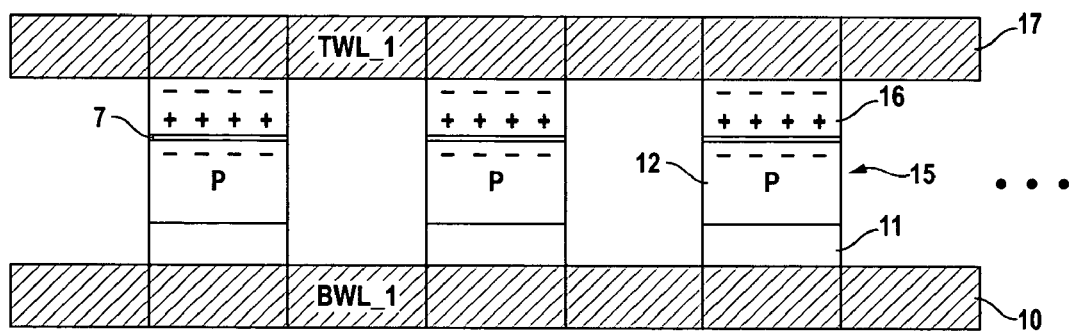
FIGS. 6a and 6b show cross section views along dashed lines (A) and (B) in FIG. 5, respectively.
Figure 6B:
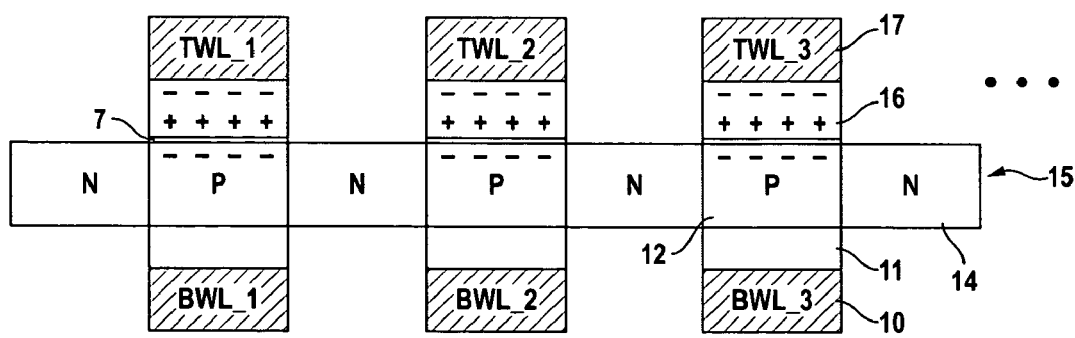

FIGS. 6a and 6b show cross section views along dashed lines (A) and (B) in FIG. 5, respectively. Accordingly, FIG. 6a shows a cross section view of a plurality of cells along the top row of cells in FIG. 5. A plurality of gate dielectric layers 11

(e.g., comprising oxide) are formed over bottom wordline 10, and a plurality of P-type channel regions 12 are formed on the plurality of gate dielectric layers 11. A plurality of dielectric layers 7 (e.g., comprising tunnel oxide) are formed over each channel region 12. A plurality of ferroelectric layers 16 are formed over the plurality of dielectric layers 7, and a top wordline 17 extending in parallel with bottom wordline 10 is formed over the plurality of ferroelectric layers 16.

FIG. 6b shows a cross section view of a plurality of cells along the far left bitline in FIG. 5. Gate dielectric layer 11 is formed over each bottom wordline BWL_1, BWL_2 and BWL_3. The floating channel layer 15 comprises alternate N-type regions 14 and P-type regions 12. N-type regions 14 form the source and drain regions of the cells, and P-type regions 12 form channel regions of the cells. Channel regions 12 extend over corresponding gate dielectric layers 11. Thus, FIG. 6B shows three serially connected cells such that a source region of one cell serves as the drain region of its adjacent cell, and vice versa. Dielectric layer 7 is formed over each channel region 12 of channel layer 15. Ferroelectric layer 16 is formed over each dielectric layer 7, and wordlines WL_1, WL_2 and WL_3 are formed over ferroelectric layer 16.

Figure 7:
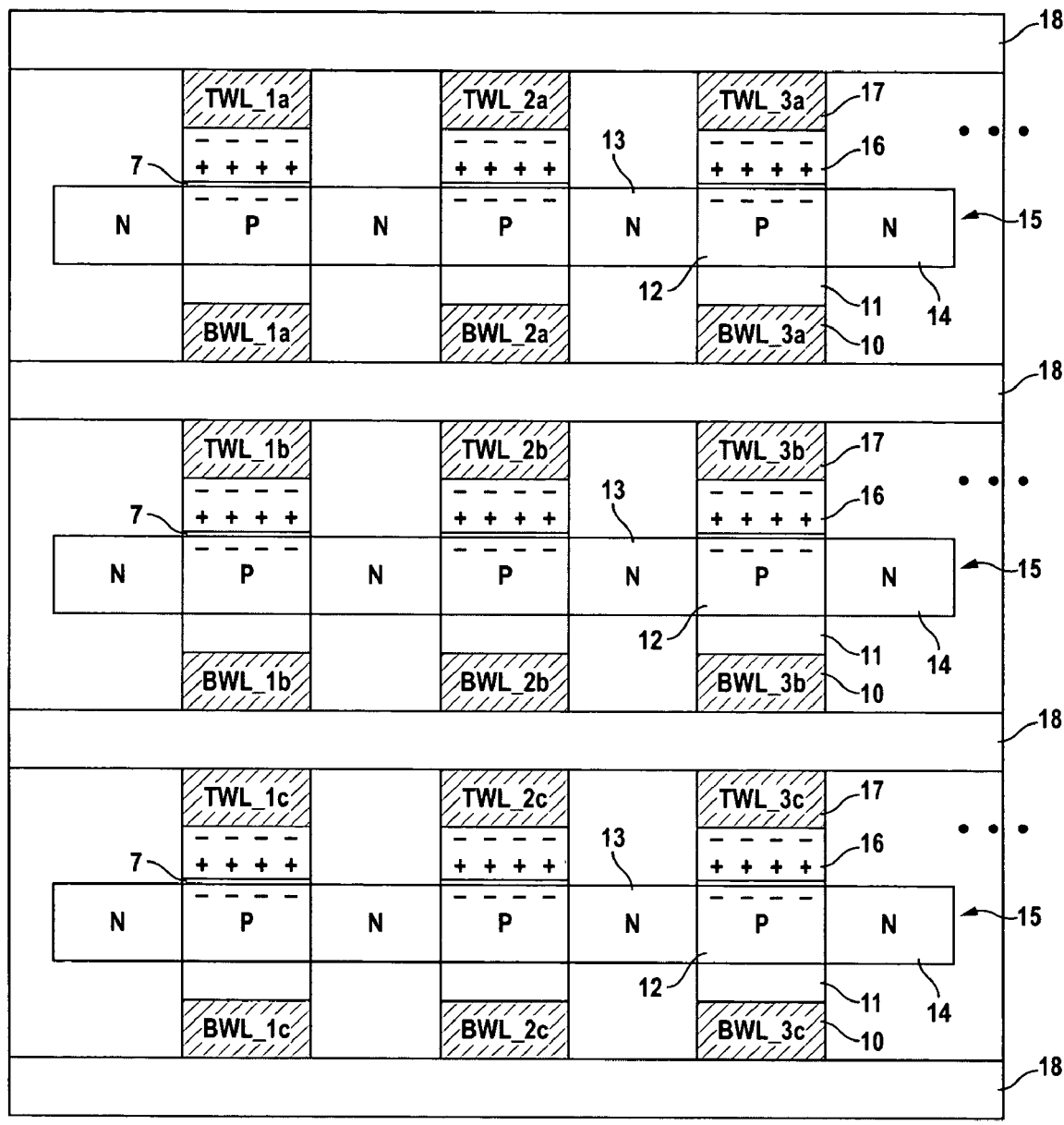
FIG. 7 shows a cross-sectional diagram illustrating a dual-gate non-volatile ferroelectric memory structure having multiple layers of cells stacked on top of each other according to an embodiment of the present invention.

FIG. 7 shows a cross-sectional diagram illustrating a non-volatile ferroelectric memory structure having multiple layers of cells stacked on top of each other according to an embodiment of the present invention. The cross section view in FIG. 7 is along the bitline direction, similar to FIG. 6b. Three layers of cells are shown being stacked on top of each other, although fewer or greater number of layers of cells could also be stacked. As shown, each layer of cells is insulated from an overlying or an underlying layer of cells by dielectric layer 18 (e.g., comprising oxide).

Figure 8:
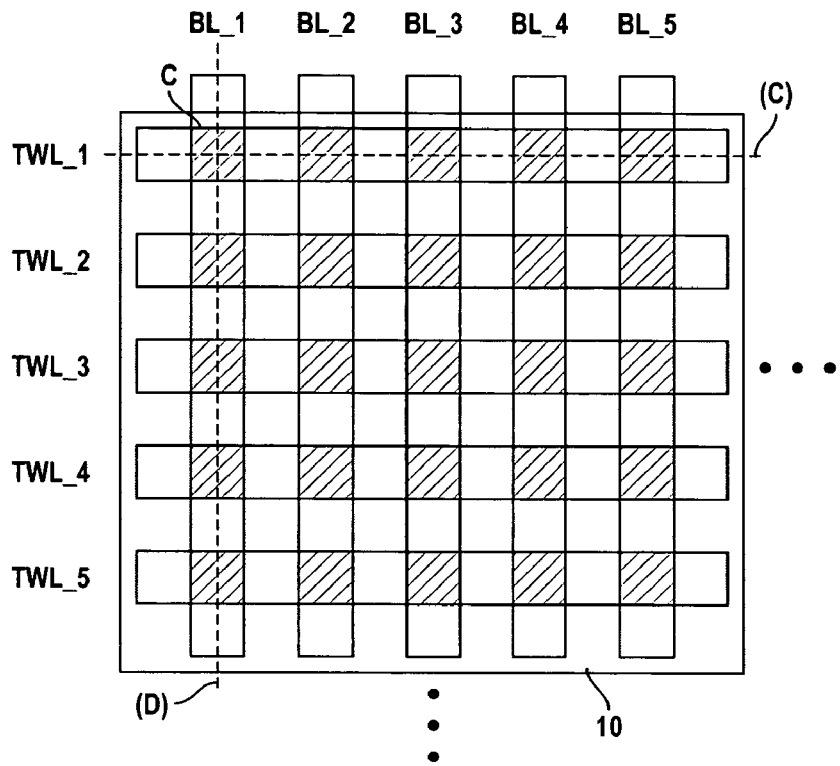
FIG. 8 is a layout diagram illustrating a dual-gate non-volatile ferroelectric memory array portion according to another embodiment of the present invention.

FIG. 8 is a layout diagram illustrating a non-volatile ferroelectric memory array portion according to another embodiment of the present invention. The array configuration in FIG. 8 is similar to that in FIG. 5 except that unlike in FIG. 5 wherein each row of cells has a dedicated bottom wordline, in FIG. 8 a single bottom wordline plane extends under a predetermined number of rows of cells.

Figure 9A:
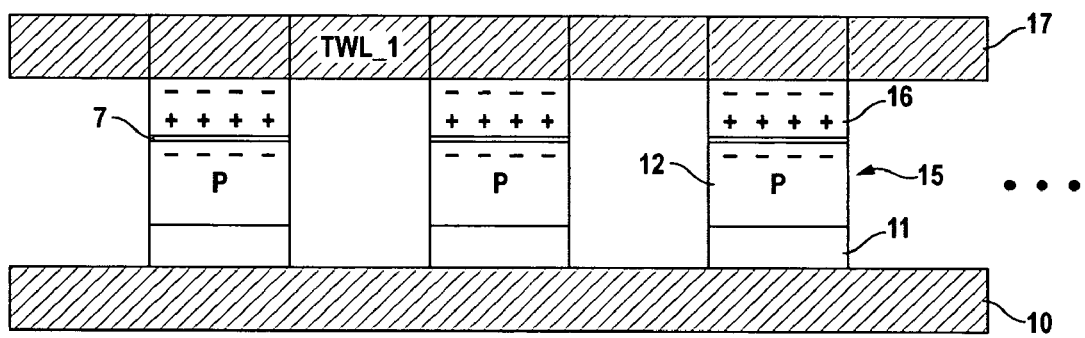
FIGS. 9a and 9b show cross section views along dashed lines (C) and (D) in FIG. 8, respectively.
Figure 9B:
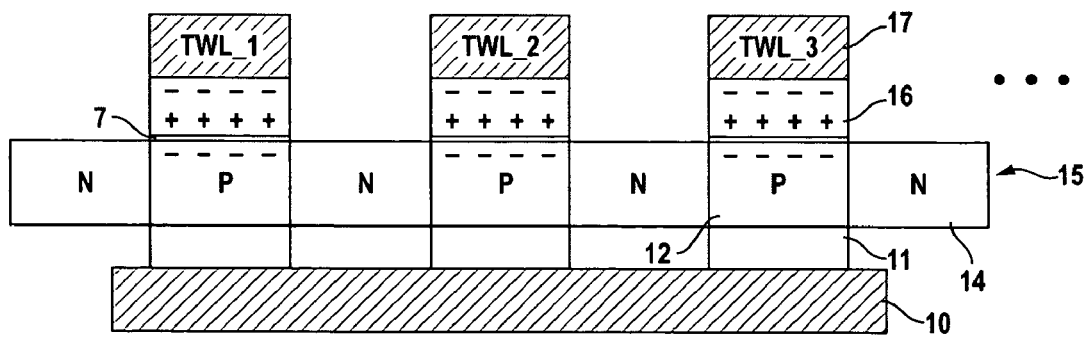

FIGS. 9a and 9b show cross section views along dashed lines (C) and (D) in FIG. 8, respectively. The cross section views in FIGS. 9a and 9b are similar to those in FIGS. 6a and 6b except that only one bottom wordline plane 10 extends under all cells along the row of cells (FIG. 9a) and along the column of cells (FIG. 9b).

Figure 10:
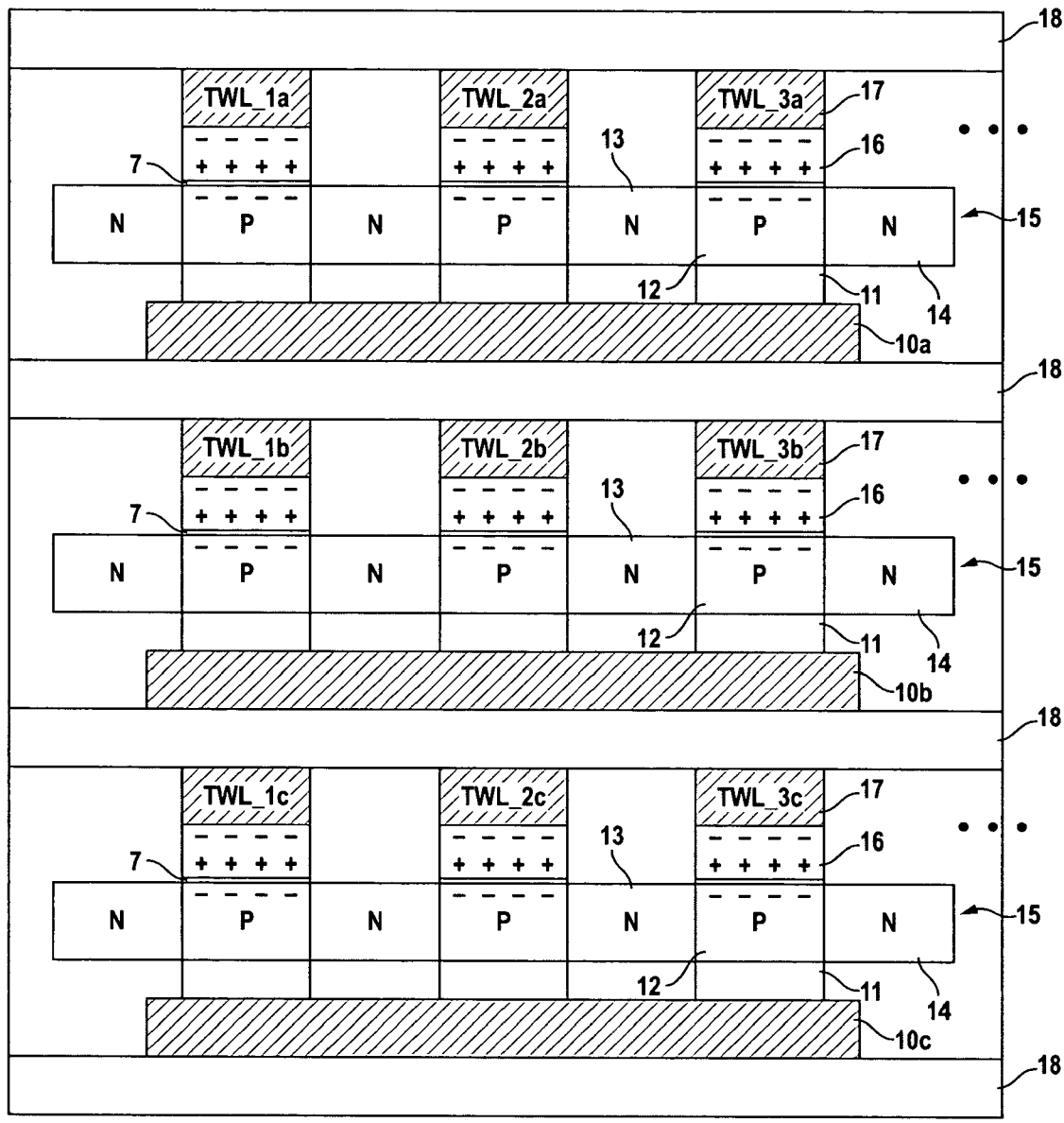
FIG. 10 shows a cross-sectional diagram illustrating a dual-gate non-volatile ferroelectric memory structure having multiple layers of cells stacked on top of each other along the bitline direction according to another embodiment of the present invention.

FIG. 10 shows a cross-sectional diagram illustrating a non-volatile ferroelectric memory structure having multiple layers of cells stacked on top of each other along the bitline direction according to an embodiment of the present invention. The cross section view in FIG. 10 is along the bitline direction, similar to FIG. 6b. Three layers of cells are shown being stacked on top of each other, although fewer or greater number of layers of cells could also be stacked. The cross section view in FIG. 10 is similar to that in FIG. 7 except that each layer of cells has a common bottom wordline plane 10. While each layer of cells is shown having a separate bottom wordline plane, one or more of the bottom wordline planes may be electrically connected to each other as needed.

Figure 11:
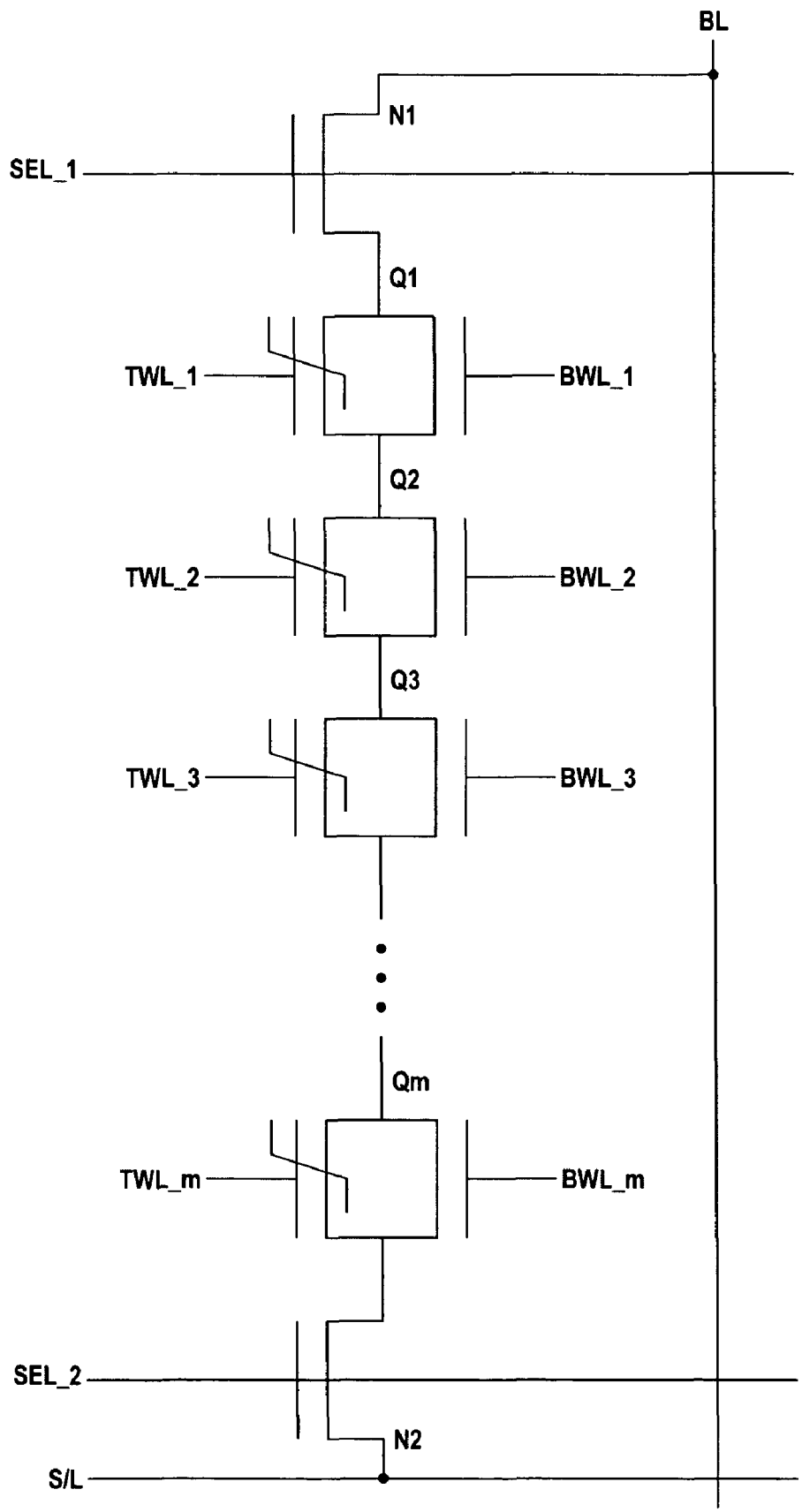
FIG. 11 is a diagram illustrating a NAND configuration circuit representation of a block of cells forming a portion of a dual-gate non-volatile ferroelectric memory array according to an embodiment of the present invention.

FIG. 11 is a diagram illustrating a NAND configuration circuit representation of a block of cells forming a portion of a non-volatile ferroelectric memory array according to an embodiment of the present invention. As shown, two select transistors N1 and N2 are serially connected with a plurality of serially-connected memory cells Q1-Qm. Upper selected transistor N1 selectively couples the bitline BL to the upper cell Q1 under the control of SEL_1 signal. Lower select transistor N2 selectively couples source line S/L to the lower cell Qm under the control of SEL_2 signal. In one embodiment, select transistors N1 and N2 0 are NMOS transistors. The plurality of memory cells Q1-Qm selectively performs a switching operation under the control of top wordlines TWL_1-TWL_m and bottom wordlines BWL_1-BWL_m. The detailed structure of each memory cell Q1-Qm is shown in FIGS. 2a and 2b. While the cells in FIG. 11 are arranged in a NAND configuration, the invention is not limited as such. For example, arranging the cells in a NOR configuration or a virtual ground configuration or any other known array configurations or architectures would be obvious to one skilled in this art in view of this disclosure.

Figure 12:
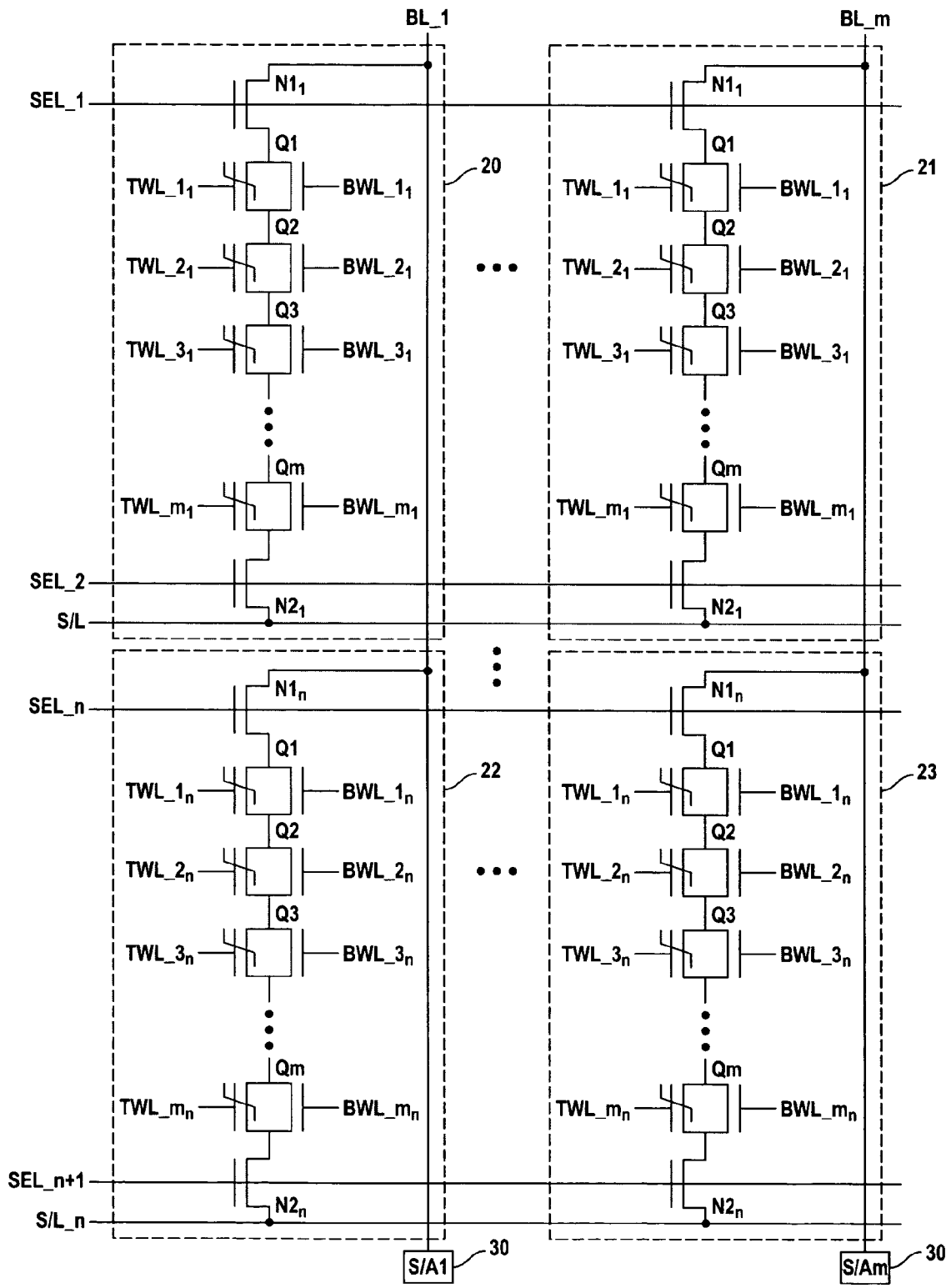
FIG. 12 is a diagram illustrating a circuit representation of a portion of a dual-gate non-volatile ferroelectric memory array according to an embodiment of the present invention.

FIG. 12 is a diagram illustrating a circuit representation of a portion of a non-volatile ferroelectric memory array wherein a plurality of cell block 20-24 each having a similar configuration to that in FIG. 11 are arranged in an array according to an embodiment of the present invention. Cell blocks 20 and 22 represent two of n cell blocks arranged along a column, all of which are coupled to bitline BL_1. Cell blocks 20 and 21 represent two of m cell blocks arranged along a row, all of which are coupled to source line S/L_1. An array of n×m cell blocks is thus formed. Each of bitlines BL_1 through BL_m is connected to a corresponding one of sense amplifiers SA1 through S/Am as shown. Sense amplifiers S/A1 to S/Am assist in detecting the state of the selected cells during a read operation.

Figure 13:
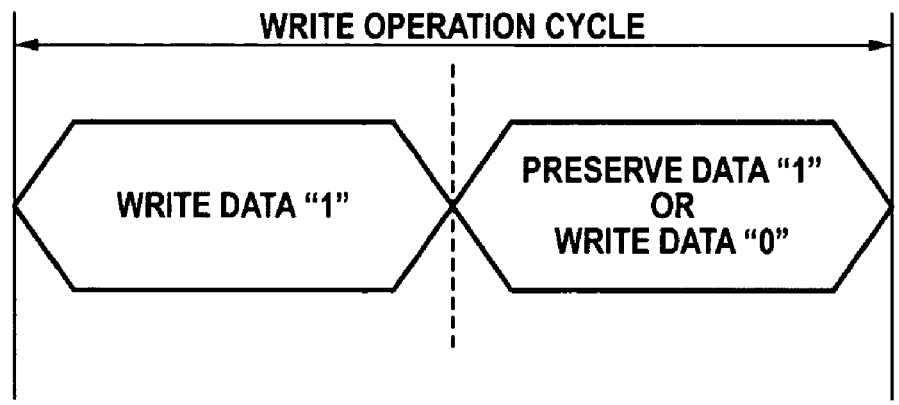
FIG. 13 is a timing diagram illustrating a write operation of the dual-gate non-volatile ferroelectric memory according to an embodiment of the present invention.

FIG. 13 is a timing diagram illustrating a write operation of the non-volatile ferroelectric memory according to an embodiment of the present invention. The write operation cycle includes two sub-cycles. That is, in the first sub-cycle, data "1" is written, and in the second sub-cycle the data "1" is either changed to a data "0" or is preserved depending on the actual data being programmed. The first and second sub-cycles will be described in more detail using the exemplary timing diagrams in FIGS. 14 and 15.

Figure 14:
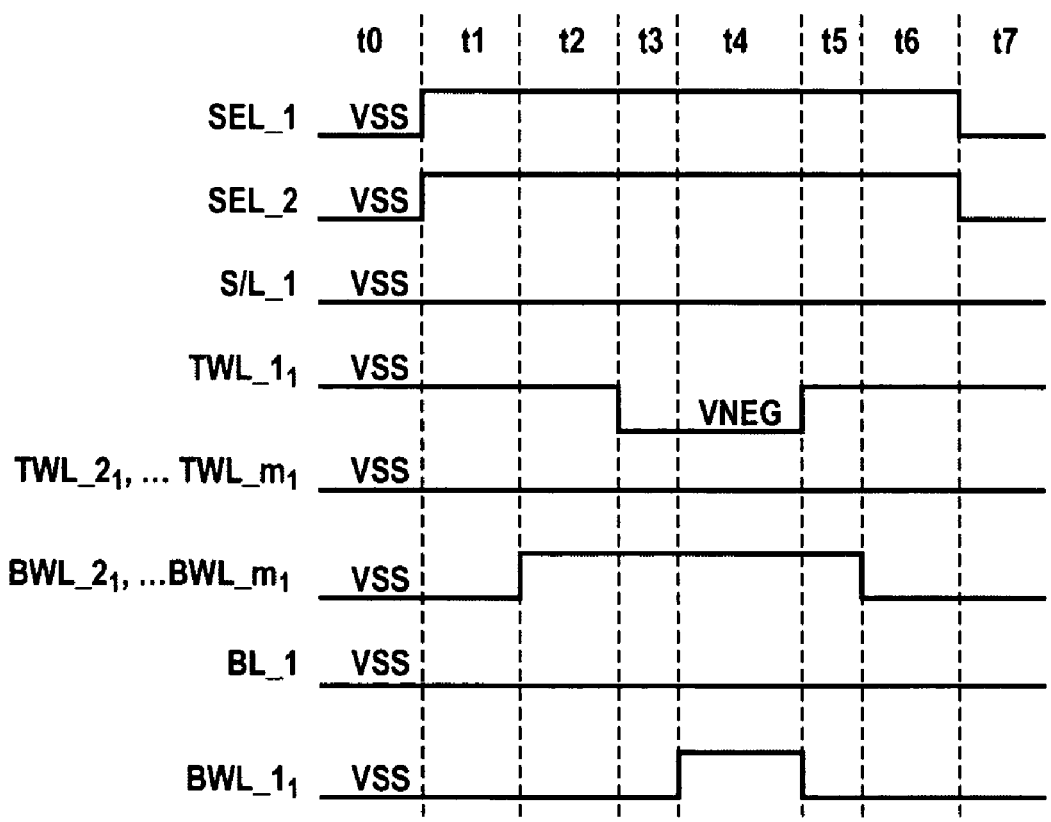
FIGS. 14 and 15 are timing diagrams respectively illustrating the first and second sub-cycles of the write operation depicted in FIG. 13, according to an exemplary embodiment of the present invention.

The FIG. 14 timing diagram will be used to describe the first sub-cycle wherein a data "1" is written to memory cell Q1 of cell block 20 in FIG. 12 according to an exemplary embodiment of the present invention. In FIG. 14, time period t0 represents a precharge period during which the memory array is placed in a precharge state. In period t1, select signals SEL_1 and SEL_2 are raised high turning on select transistors $N1_1$ and $N2_1$ of cell block 20. Bit line BL_1 is thus electrically coupled to memory cell Q1 via select transistor $N1_1$, and source line S/L_1 is electrically coupled to memory cell Qm via select transistor $N2_1$. During t1, top wordlines $TWL\_1_1$ to $TWL\_m_1$ and bottom wordlines $BWL\_1_1$ to $BWL\_m_1$ are maintained at a low level.

In period t2, all bottom wordlines in cell block 20 except bottom wordline $BWL\_1_1$ are raised high to turn on cells Q2-Qm so that the ground voltage <GND> on source line S/L_1 is transferred to the source of memory cell Q1. With source and drain of cell Q1 biased to ground potential, a negative voltage VNEG is then applied to top wordline $TWL\_1_1$ in period t3. In period t4, bottom wordline $BWL\_1_1$ is raised high to turn on the NMOS transistor of cell Q1. As described above in connection with FIG. 3a, the biasing of Q1 during period t4 results in positive charges being attracted to the cell channel region whereby the memory cell obtains a high resistance state and thus stores a data "1".

In period t5, the voltages on top wordline $TWL\_1_1$ and bottom wordline $BWL\_1_1$ are changed to the ground potential. In period t6, the remainder of the bottom wordlines $BWL\_2_1$ to $BWL\_m_1$ is changed to the ground state. Thereafter, in a period t7, select transistors $N1_1$ and $N2_1$ are turned off by changing selecting signals SEL_1 and SEL_2 to the low state.

Figure 15:
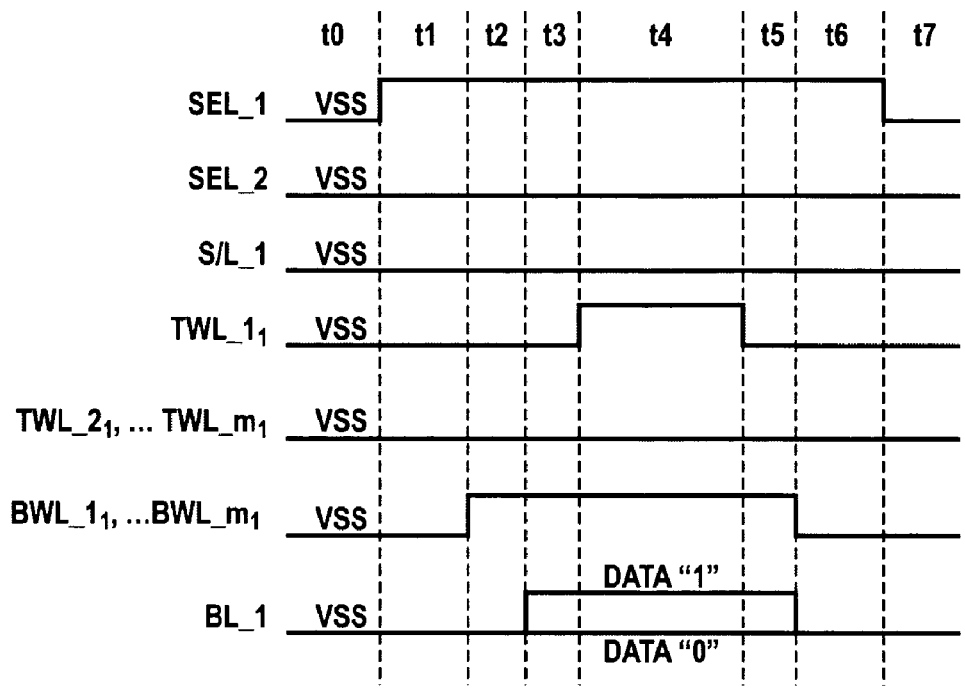

The FIG. 15 timing diagram will be used to describe the second sub-cycle wherein either a data "0" is written to memory cell Q1 of cell block 20 in FIG. 12 or the data "1" written in the first sub-cycle is preserved, according to an exemplary embodiment of the present invention. In period t1, select transistor $N1_1$ in cell block 20 is turned on by raising select signal $SEL\_1_1$ high. Bitline BL_1 is thus electrically coupled to memory cell Q1. Select signal SEL_2, source line S/L_1, top wordlines $TWL\_1_1$ to $TWL\_m_1$, bottom wordlines $BWL\_1_1$ to $BWL\_m_1$, and bitline BL_1 are maintained at a low state. Thereafter, in period t2, all bottom wordlines $BWL\_1_1$ to $BWL\_m_1$ in cell block 20 are raised high. As a result, the voltage on bitline BL_1 is transmitted to source/drains of all cells Q1 to Qm in block 20.

In period t3, if data "0" is to be written to memory cell Q1, bit line BL_1 is maintained at the ground potential. On the other hand, if data "1" written to Q1 in the preceding sub-cycle is to be preserved, bit line BL_1 is raised high. In period t4, top wordline $TWL\_1_1$ is raised high. In the case where data "0" is to be written to cell Q1, BL_1 is low when $TWL\_1_1$ is raised high. In this case, as described above in connection with FIG. 4a, the biasing of Q1 during period t4 results in negative charges being attracted to the cell channel region whereby memory cell Q1 obtains a low resistance state and thus stores a data "0". In the case where the previously stored data "1" is to be preserved, BL_1 is high when $TWL\_1_1$ is raised high in period t4. In this case, biasing of cell Q1 during t4 is such that the state of cell Q1 remains unchanged.

In period t5, top wordline $TWL\_1_1$ transitions low, and in period t6 the bottom wordlines in cell block 20 and bit line BL_1 also transition low. In period t7, select transistor $N1_1$ is turned off by changing the select signal SEL_1 to the low state. The full write operation cycle as depicted in FIG. 13 is thus completed.

Figure 16:
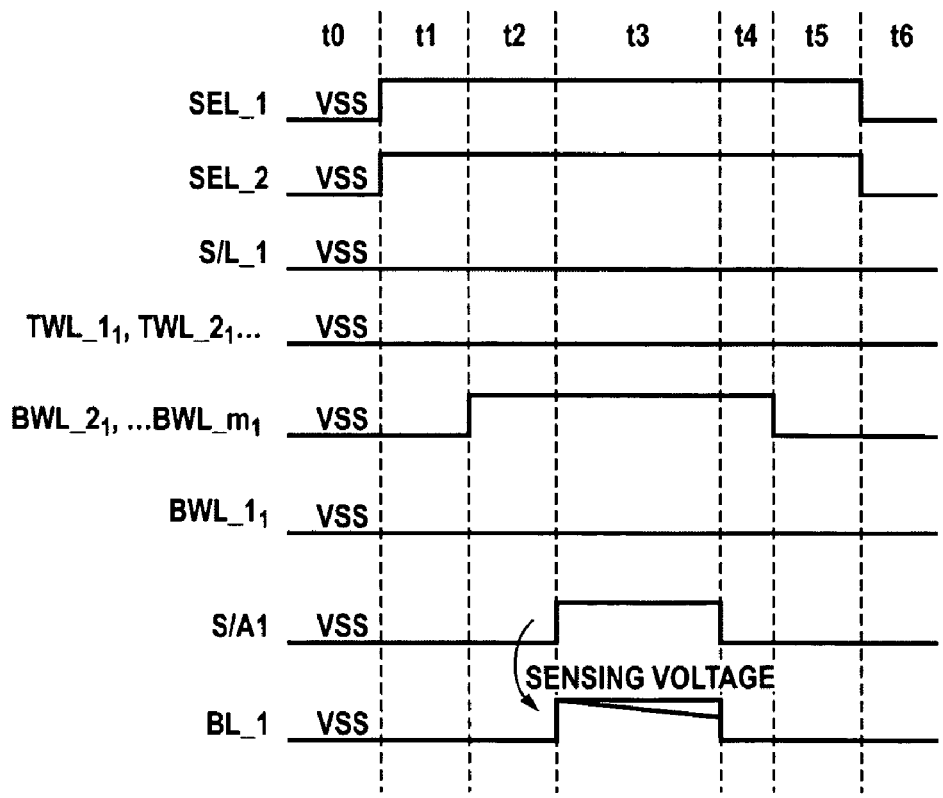
FIG. 16 is a timing diagram illustrating a read operation of the dual-gate non-volatile ferroelectric memory according to an exemplary embodiment of the present invention.

FIG. 16 is a timing diagram which will be used to describe a read operation wherein memory cell Q1 in cell block 20 in FIG. 12 is accessed, according to an exemplary embodiment of the present invention. In period t0, the memory array is in a precharge state. In period t1, select transistors $N1_1$ and $N2_1$ are turned on by raising select signals SEL_1 and SEL_2 to the high level. Bit line BL_1 and source line S/L_1 are thus coupled to transistors Q1 and Qm, respectively. During t1, all of the top wordlines $TWL\_1_1$ to $TWL\_m_1$ in cell block 20, bitline BL_1, source line S/L_1 and all the bottom wordlines $BWL\_1_1$ to $BWL\_m_1$ are maintained at the low state.

In period t2, all of the bottom wordlines except $BWL\_1_1$ are raised high so that the ground voltage <GND> on source line S/L_1 is transferred to the source of memory cell Q1. During t2, all of the top wordlines in cell block 20 are maintained at the ground state. At this time, depending on the data stored in Q1, cell Q1 would either be in conducting or in non-conducting state. In period t3, sense amplifier S/A1 assists in detecting the state of the data stored in Q1.

As described above in connection with FIG. 3b, with a data "1" stored in cell Q1, positive charges are present in the channel region of cell Q1. With positive charges in the channel region and ground potential applied to all of top wordline $TWL\_1_1$, bottom wordline $BWL\_1_1$, drain region 13 and source region 14, the cell is in the off state and thus does not conduct any current. With no current conduction in cell Q1, upon enabling sense amplifier S/A1 in time period t3, the sense amplifier detects a data "1".

On the other hand, as described above in connection with FIG. 4b, with a data "0" stored in cell Q1, negative charges are present in the channel region of cell Q1. With negative charges in the channel region and ground potential applied to all terminals of cell Q1, memory cell Q1 is in the on state, and thus upon applying a positive voltage to bitline BL_1 current flows through cell Q1. Upon enabling sense amplifier S/A1 in time period t3, the current conduction through cell Q1 is detected by sense amplifier S/A1 and a data "0" is thus read.

In time period t4, sense amplifier S/A1 is disabled. In time period t5, bottom wordlines $BWL\_2_1$ to $BWL\_m_1$ return to the low state, and in time period t6, select transistors $N1_1$ and $N2_1$ are deselected in response to select signals SEL_1 and SEL_2 going low.

In the various embodiments described above, the source and drain regions of each cell are N-type and the channel region intermediate the source and drain regions is P-type. This can be referred to as an enhancement type cell. In accordance with another embodiment, referred to hereinafter as the depletion type cell embodiment, the source and drain regions as well as their intermediate channel region are all P-type. FIGS. 17a-17b and 18-22 will be used to describe the structure, the method of manufacture, and operation of the depletion cell embodiment.

Figure 17A:
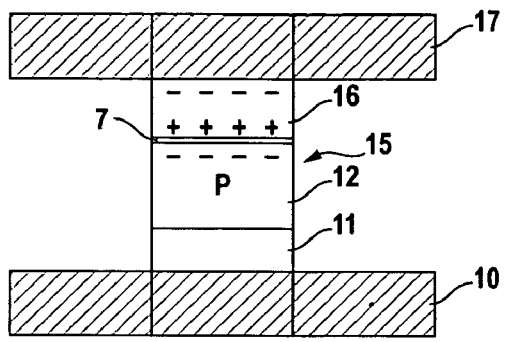
FIGS. 17a and 17b are cross section views of a dual-gate non-volatile ferroelectric memory cell along the wordline and bitline dimension, respectively, wherein the entire channel layer is P-type semiconductor, according to another embodiment of the invention.
Figure 17B:
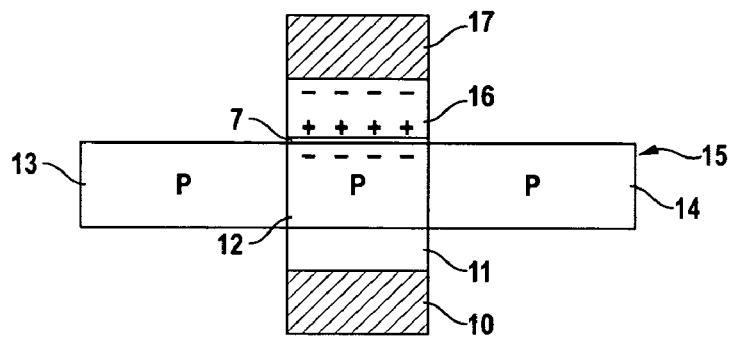

FIGS. 17a and 17b are cross section views of a dual-gate non-volatile ferroelectric memory cell wherein the entire channel layer 15 is P-type. FIG. 17a is a cross section view along the wordline dimension. A bottom wordline 10 (e.g. comprising polysilicon) is arranged in parallel with a top wordline 17 (e.g., comprising polysilicon). Bottom wordline 10 and top wordline 17 are selectively driven by a row decoder (not shown). A gate dielectric layer 11 (e.g., comprising oxide) insulates bottom wordline 10 from an overlying P-type channel region 12 of a floating channel layer 15. A dielectric layer 7 (e.g., comprising tunnel oxide) is formed over channel region 12 of floating channel layer 15. Ferroelectric layer 16 is formed over dielectric layer 7, and a top wordline 17 is formed over ferroelectric layer 16. A six layer cell structure is thus formed.

FIG. 17b is a cross section view along the bitline dimension (i.e., perpendicular to the wordline dimension). The same six layer structure is apparent in FIG. 17b, except that floating channel layer 15 is shown to include P-type source region 14 and P-type drain region 13 flanking each side of P-type channel region 12. The semiconductor material of floating channel layer 15 may comprise one or more of carbon nano tube, nano-material, nano-wire, silicon and Ge (Germanium), and/or other suitable material. The source and drain regions may be formed so as to have a higher doping concentration than channel region 12, or the entire channel layer 15 may have a uniform doping. The latter alternative is advantageous in that since the entire channel layer 15 has the same doping concentration, the misalignment of source and drain regions relative to the bottom wordlines present in the former alternative are eliminated.

The dual-gate cell depicted by FIGS. 17a and 17b is formed over a non-conducting material such as dielectric material (not shown), and as such the cell structure as well as its operation are completely independent of the starting material (or substrate). Thus, any starting material including commercially available starting material such as bulk silicon and silicon-on-insulator (SOI) can be used.

Figure 18:
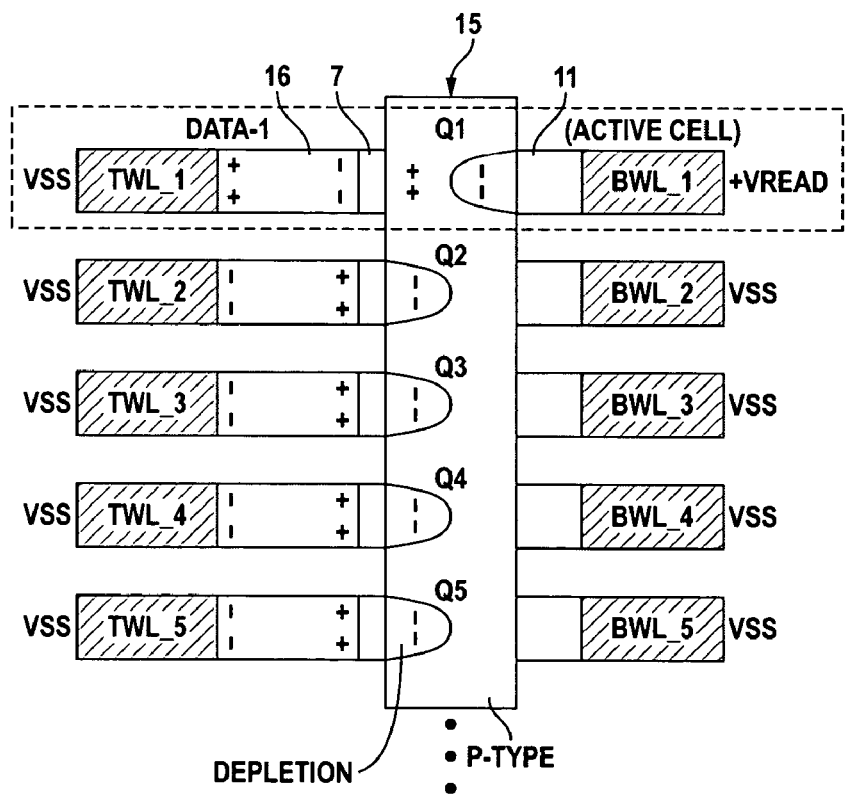
FIG. 18 shows a cross section view along the column (bitline) direction of five memory cells having a structure similar to that depicted by FIGS. 17a and 17b, according to an embodiment of the invention.

FIG. 18 shows a cross section view of five memory cells Q1-Q5 along the column (bitline) direction in the memory array, similar to the cross section view in the FIG. 6b embodiment except that the cross section view in FIG. 18 is rotated 90° counter-clockwise relative to the cross section view in FIG. 6b. In FIG. 18, gate dielectric layer 11 (e.g., comprising oxide) is formed over each bottom wordline BWL_1 to BWL_5. Floating channel layer 15 extending over gate dielectric layer 11 is entirely P-type. Thus, five serially connected cells are formed such that a source region of one cell serves as the drain region of its adjacent cell. Dielectric layer 7 (e.g., comprising tunnel oxide) is formed over each channel region of channel layer 15. The channel region of each cell corresponds to the portion of floating channel layer 15 which is sandwiched by dielectric layers 7 and 11. Ferroelectric layer 16 is formed over each dielectric layer 7, and top wordlines TWL_1 to TWL_5 are formed over ferroelectric layer 16.

FIG. 18 also shows the required biasing for reading the state of cell Q1 wherein cell Q1 stores data "1". As can be seen, all the top wordlines TWL_1 to TWL_5 and all the bottom wordlines BWL_1 to BWL_5 are biased to ground (VSS) except bottom wordline BWL_1 is biased to a positive voltage +Vread. This biasing results in turning on cells Q2-Q5 regardless of the data stored in cells Q2-Q5, thus enabling the state of Q1 to be read. With data "1" stored in Q1 and zero volt applied to TWL_1, cell Q1 is in the conducting state. In one embodiment, +Vread is greater than the threshold voltage Vth of the MOS transistor of the cell.

Figure 19:
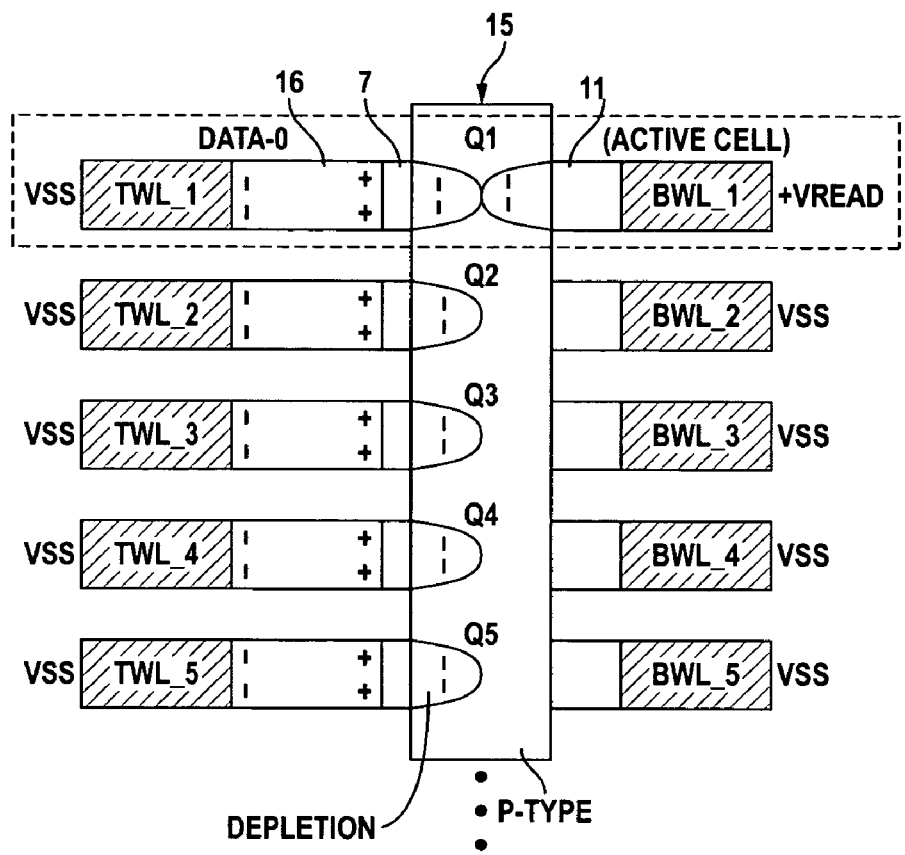
FIG. 19 is a cross section view similar to that in FIG. 18, illustrating read of low data (data "0")

FIG. 19 is a cross section view identical to that in FIG. 18, and is provided to illustrate reading of a data "0" stored in cell Q1. The cell string in FIG. 19 is biased similarly to that in FIG. 18, thus cells Q2-Q5 are turned on enabling the state of Q1 to be read. With data "0" stored in Q1 and zero volt applied to TWL_1, the portion of channel region directly below TWL_1 is depleted of positive charges as shown in FIG. 19. Upon applying the positive voltage +Vread to bottom wordline BWL_1, the portion of the channel directly above BWL_1 also depletes of positive charges, thus completely pinching off the channel region of Q1 as shown in FIG. 19. Accordingly, no current flows through Q1.

Figure 20:
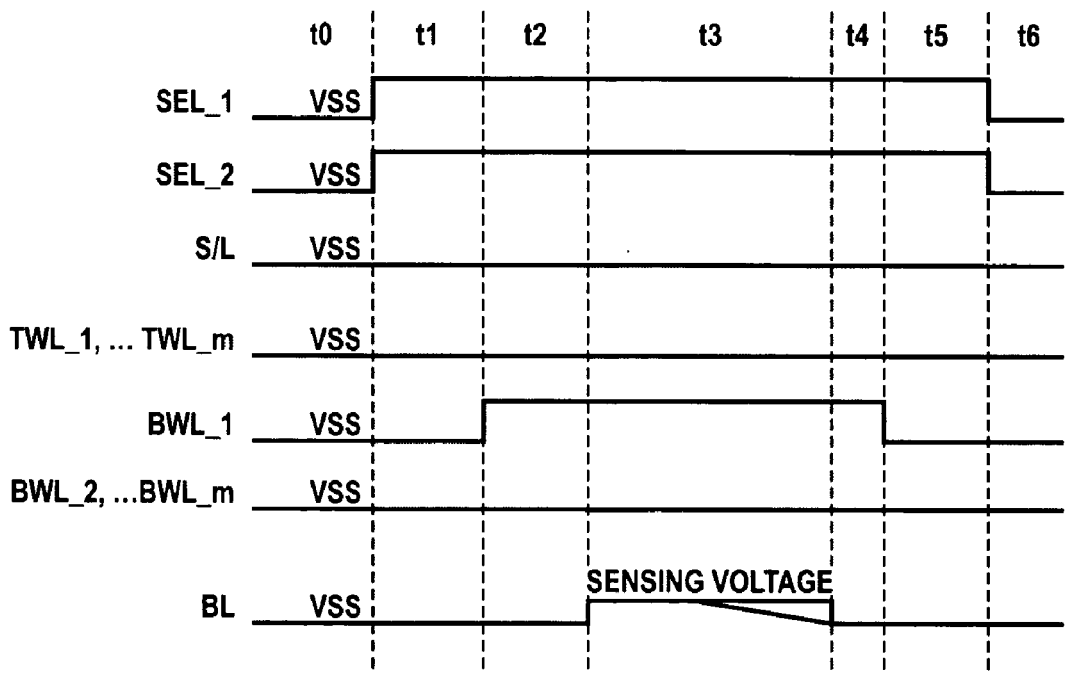
FIG. 20 is a timing diagram illustrating a read operation of the dual-gate non-volatile ferroelectric memory depicted by FIGS. 17a and 17b, according to an exemplary embodiment of the present invention.

FIG. 20 shows the timing diagram for a read operation. The circuit diagram in FIG. 11 will be used to describe the read operation depicted by the FIG. 20 timing diagram however, note that the string of cells Q1 to Qm in FIG. 11 would be of the depletion mode type shown in FIGS. 17a-17b. The FIG. 20 timing diagram shows various signals for reading the state of cell Q1 in FIG. 11. In period t0, the memory array is in a precharge state. In period t1, select transistors N1 and N2 are turned on by raising select signals SEL_1 and SEL_2 to the high level. Bit line BL and source line S/L are thus coupled to transistors Q1 and Qm, respectively. With all the bottom wordlines BWL_1 to BWL_m in the low state, all cells Q1-Qm are in the on state during t1.

In period t2, bottom wordline BWL_1 is raised high. The positive charges in the channel region directly above BWL_1 are depleted. In period t3, the data stored in Q1 is detected by applying a positive voltage to the bitline BL. If cell Q1 is programmed with data "1", Q1 would be in a conducting state as described above in connection with FIG. 18. In this case, the potential on the bitline drops as shown in FIG. 20 by the line depicting a gradual drop in voltage on BL during t3. If cell Q1 is programmed with data "0", Q1 would be in a non-conducting state as described above in connection with FIG. 19. In this case, the potential on the bitline does not drop during t3 as shown in FIG. 20 by the line depicting a constant voltage on BL during t3.

In time period t54, bottom wordline BWL_1 returns to the low state, and in time period t6, select transistors N1 and N2 are deselected in response to select signals SEL_1 and SEL_2 going low. While the timing diagram in FIG. 20 reflects the embodiment wherein select transistors N1 and N2 are of the enhancement type, the invention is not limited as such. In an alternate embodiment, select transistors N1 and N2 are of the P-type depletion variety (i.e., the source, drain, and channel regions are all P-type, similar to cells Q1-Qm). This embodiment is advantageous in that the structural similarities between the depletion type select transistors and the depletion type memory cells result in reduced process complexity and reduced die size, and thus lower cost. For this embodiment, the transition of select signals SEL_1 and SEL_2 in the FIG. 20 timing diagram would be reversed.

The write operation cycle for the depletion type cell embodiment includes two sub-cycles, similar to that shown in FIG. 13. That is, in the first write sub-cycle, data "1" is written, and in the second write sub-cycle the written data "1" is either changed to data "0" or is preserved depending on the actual data being programmed. The first and second sub-cycles will be described in more detail using the exemplary timing diagrams in FIGS. 21 and 22 in conjunction with the circuit diagram in FIG. 11.

Figure 21:
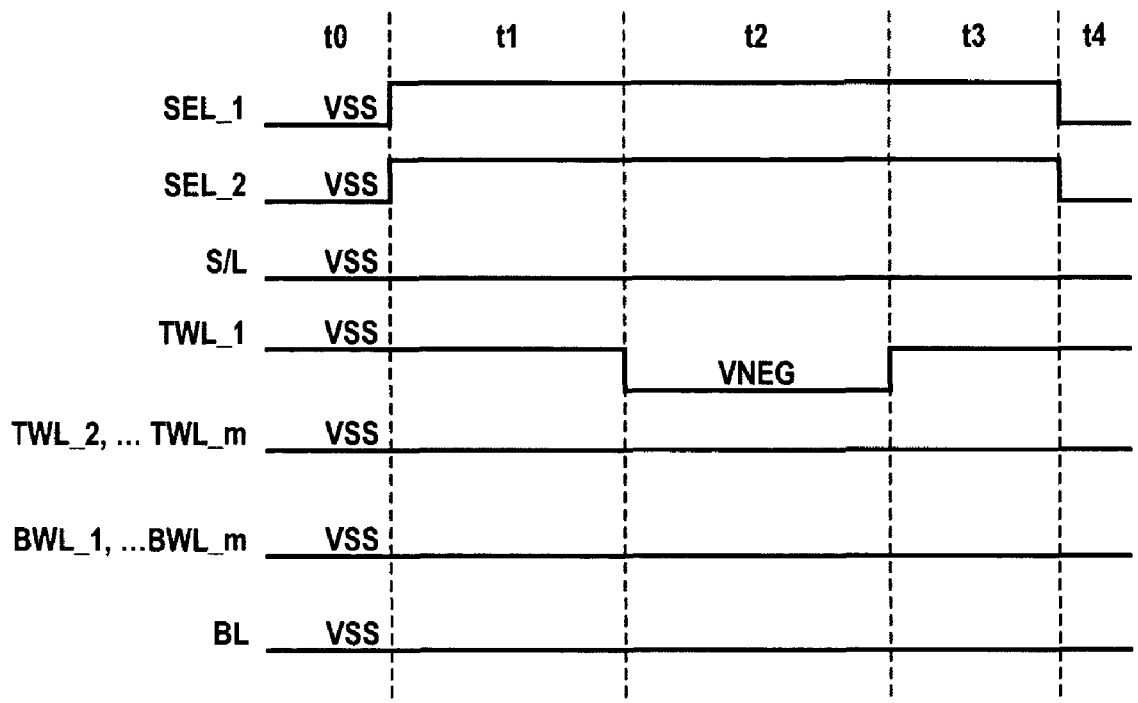
FIGS. 21 and 22 are timing diagrams respectively illustrating the first and second sub-cycles of the write operation depicted in FIG. 13 for the dual-gate non-volatile ferroelectric memory depicted by FIGS. 17a and 17b, according to an exemplary embodiment of the present invention.

The FIG. 21 timing diagram will be used to describe the first sub-cycle wherein a data "1" is written to memory cell Q1 in FIG. 11, according to an exemplary embodiment of the present invention. In FIG. 21, time period t0 represents a precharge period during which the memory array is placed in a precharge state. In period t1, select signals SEL_1 and SEL_2 are raised high turning on select transistors N1 and N2. Bit line BL is thus electrically coupled to memory cell Q1 via select transistor N1, and source line S/L is electrically coupled to memory cell Qm via select transistor N2. During period t1, with all the bottom wordlines BWL_1 to BWL_m in the low state, all cells Q1-Qm are in the on state.

In period t2, with source and drain of cell Q1 biased to ground potential, a negative voltage VNEG is applied to the top wordline TWL_1. This biasing of Q1 during period t2 results in positive charges being attracted to the channel region of Q1 whereby memory cell Q1 obtains a low resistance state and thus stores a data "1". In time period t3, bottom wordline BWL_1 transitions back to the ground potential, and in time period t4, select transistors N1 and N2 are deselected in response to select signals SEL_1 and SEL_2 going low.

Figure 22:
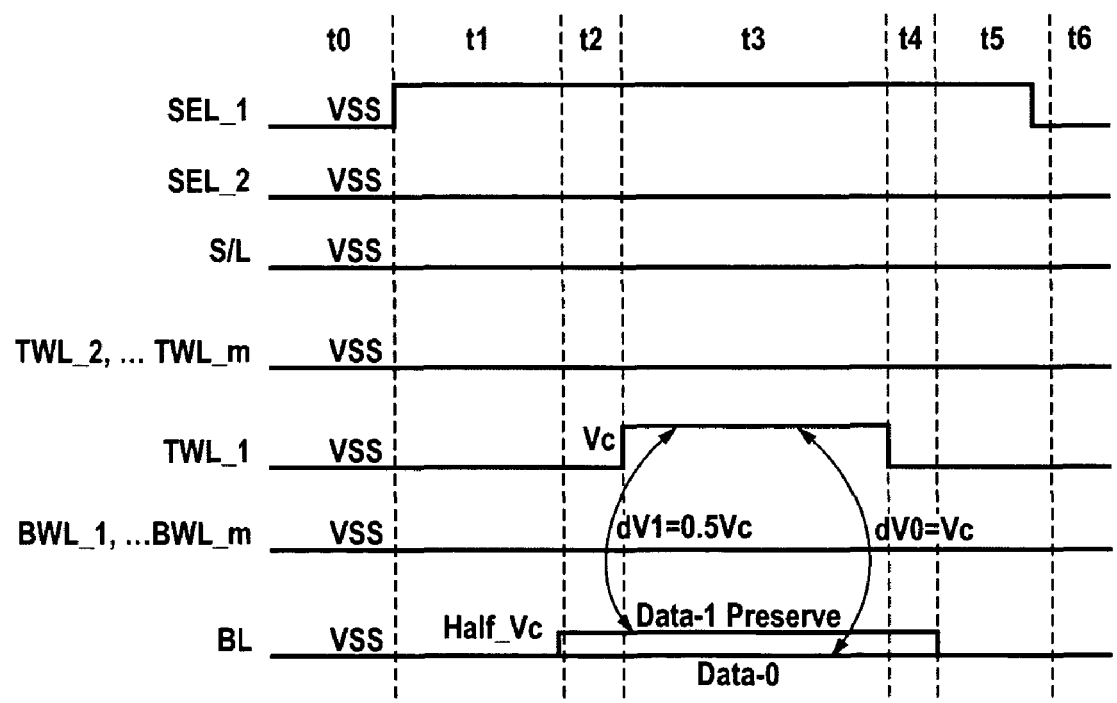

The FIG. 22 timing diagram will be used to describe the second write sub-cycle wherein either a data "0" is written to memory cell Q1 in FIG. 11 or the data "1" written in the first sub-cycle is preserved, according to an exemplary embodiment of the present invention. In period t1, select transistor N1 in FIG. 11 is turned on by raising select signal SEL_1 high. Bitline BL is thus electrically coupled to memory cell Q1, while select signal SEL_2, source line S/L, top wordlines TWL_1 to TWL_m, bottom wordlines BWL_1 to BWL_m, and bitline BL are maintained at a low state.

In period t3, if data "0" is to be written to memory cell Q1, bit line BL is maintained at the ground potential. On the other hand, if data "1" written to Q1 in the preceding sub-cycle is to be preserved, bit line BL is raised high to a potential equal to one half the coercive polarization voltage Vc. The voltage Vc represents the voltage which when applied across the ferroelectric film (i.e., the top wordline is at voltage Vc and the channel region of the cell is at ground potential), the ferroelectric film polarizes to the "0" state. In period t3, top wordline TWL_1₁ is raised high to Vc. In the case where data "0" is to be written to cell Q1, bitline BL is at ground potential when TWL_1 is raised to Vc, thus the full Vc appears across the ferroelectric film, thus polarizing the ferroelectric film to the "0" state. That is, the biasing of Q1 during t3 results in negative charges being attracted to the cell channel region whereby memory cell Q1 obtains a high resistance state and thus stores a data "0". In the case where the previously stored data "1" is to be preserved, bitline BL is at one-half Vc when TWL_1 is raised to Vc in period t3. Thus, during t3 the voltage appearing across the ferroelectric film equals one-half Vc, which is insufficient to change the state of the cell, thus the data "1" written in the first sub-cycle is preserved.

In period t4, top wordline TWL_1 transitions low, and in period t5 bit line BL also transitions low in the case where data "1" is preserved. In period t6, select transistor N1 is turned off by changing select signal SEL_1 back to the low state. The full write operation cycle as depicted in FIG. 13 is thus completed.

Note that although in the cross section views in FIGS. 6a, 6b, 7, 9a, 9b, 10, 18, 19, and other similar figures no indication is provided as to whether any material is present in the gaps between adjacent cells along rows and columns, in practice, one or more non-conducting material such as aluminum oxide ($Al_2O_3$), silicon dioxide ($SiO_2$), oxides of nitrogen (NxOy, where x and y represent integers), oxides of tantalum (TaxOy, where x and y represent integers), or other high k material fill(s) these gaps.

Also, while FIGS. 2A, 2B, 3A, 3C, 4A, 4B, 6A, 6B, 7, 9A, 9B, 10, 17A, 17B, 18 and 19 show tunnel oxide 7, gate dielectric 11 and ferroelectric layer 16 are patterned so that they extend only over channel region 12, the invention is not limited as such. For example, in one embodiment, tunnel oxide 7, gate dielectric 11 and ferroelectric layer 16 are not patterned so that they extend not only over channel region 12, but also over the source and drain regions as well as other regions between adjacent cells. This embodiment is advantageous in that the manufacturing process is made simple by eliminating a number of masks and the required alignments without impacting the operation or performance of the memory."

As can be seen from the various embodiments described above, data stored in a cell is not destroyed in a read operation thus achieving NDRO (Non Destructive Read Out). As a result, the reliability of the cell is improved at the nano scale ferroelectric cell, and the read operation speed is also improved. Additionally, the dual-gated structure of the present invention lends itself well to the NAND array configuration, thus enabling manufacturing of very high density memory. Moreover, the particular structure of the dual-gate cell is versatile in terms of the starting material on which it can be formed. Any starting material such as bulk silicon, silicon on insulator (SOI), any polymers, or any other commercially available starting may be used.

While the above-described embodiments of the present invention include various implementations of the dual-gate cell in a NAND array configuration, implementation of the dual-gate cell in a NOR array configuration, virtual ground array configuration, or other array configurations would be obvious to one skilled in the art in view of this disclosure.

While the present invention has been particularly shown and described with reference to exemplary embodiments thereof, it will be understood by those of ordinary skill in the art that various changes in form and details may be made therein without departing from the spirit and scope of the present invention. For these and other reasons, therefore, the above description should not be taken as limiting the scope of the invention, which is defined by the appended claims.

What is claimed is:

1. A non-volatile memory comprising:
   a memory array having strings of serially connected memory cells arranged along rows and columns and a common bottom wordline plane comprising a conductive material, each serially connected memory cell comprising:
   a first gate forming part of the common bottom wordline plane;
   a first dielectric layer extending over the first gate;
   a semiconductor region extending over the first dielectric layer, the semiconductor region including a channel region extending directly over the first gate;
   a second dielectric layer extending over the semiconductor region;
   a ferroelectric layer extending over the second dielectric layer; and
   a second gate comprising a second conductive material extending over the ferroelectric layer, the second gate forming part of one of a plurality of top wordlines, the plurality of top wordlines extending along the rows parallel to the common bottom wordline plane,
   wherein the channel regions of the serially connected memory cells are isolated from each other along the horizontal dimension, and the common bottom wordline plane extends continuously under multiple wordlines of the plurality of top wordlines.

2. The non-volatile memory of claim 1, wherein each of the strings of serially connected memory cells has one end connected to a bitline through a first select transistor and another end connected to a source line through a second select transistor.

3. The non-volatile memory of claim 1, wherein, within each of the strings of serially connected memory cells, the semiconductor region in each of the memory cells is connected to the semiconductor region in an adjacent memory cell to form a floating channel layer that extends throughout each of the memory cells.

4. The non-volatile memory cell of claim 3, wherein the floating channel layer has one end connected to a bitline through a first select transistor and another end connected to a source line through a second select transistor.

5. The non-volatile memory of claim 1, wherein the second dielectric layer is a tunnel oxide.

6. The non-volatile memory of claim 1, wherein two or more of the strings of serially connected memory cells are stacked on top of and insulated from one another.

7. The non-volatile memory of claim 1, wherein the semiconductor region comprises a source region and a drain region, and the channel region extends between the source and drain regions.

8. The non-volatile memory of claim 7, wherein the source region and the drain region have a conductivity type opposite that of the channel region.

9. The non-volatile memory of claim 7, wherein each of the strings of serially connected memory cells has one end connected to a bitline through a first select transistor and another end connected to a source line through a second select transistor.

10. The non-volatile memory cell of claim 9 wherein:
    the source region, the drain region, and the channel region of the semiconductor region are of a first conductivity type, and
    each of the first and second select transistors includes a source region, a drain region and a channel region therebetween, the source region, the drain region and the channel region of each of the first and second select transistors being of the first conductivity type.

11. The non-volatile memory cell of claim 9 wherein:
the source region, the drain region, and the channel region of the semiconductor region are of a first conductivity type, and
each of the first and second select transistors includes a source region, a drain region and a channel region therebetween, the source region and the drain region of each of the first and second select transistors being of a second conductivity type.

12. The non-volatile memory cell of claim 1, wherein the semiconductor region comprises one or more of carbon nano tubes, nano-materials, nano-wires, silicon and germanium.

* * * * *